(12) United States Patent
Tawarayama (10) Patent No.: US 8,023,759 B2
(45) Date of Patent: Sep. 20, 2011

(54) FOCUS MONITORING METHOD

(75) Inventor: Kazuo Tawarayama, Tsukuba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 964 days.

(21) Appl. No.: 11/947,239

(22) Filed: Nov. 29, 2007

(65) Prior Publication Data

US 2008/0137981 A1     Jun. 12, 2008

(30) Foreign Application Priority Data

Nov. 30, 2006  (JP) ................. 2006-324468

(51) Int. Cl.
*G06K 9/40* (2006.01)
(52) U.S. Cl. ...................................................... 382/255
(58) Field of Classification Search ................ 382/255; 355/39, 55; 356/624
See application file for complete search history.

(56) References Cited

U.S. PATENT DOCUMENTS

| | | | |
|---|---|---|---|
| 5,956,141 A * | 9/1999 | Hayashi | 356/496 |
| 6,549,270 B1 | 4/2003 | Ota | |
| 6,667,139 B2 * | 12/2003 | Fujisawa et al. | 430/30 |
| 6,833,904 B1 | 12/2004 | Komatsuda | |
| 2002/0015158 A1 * | 2/2002 | Shiode et al. | 356/614 |
| 2003/0048458 A1 * | 3/2003 | Mieher et al. | 356/601 |
| 2004/0070771 A1 * | 4/2004 | Ausschnitt | 356/625 |
| 2006/0141375 A1 * | 6/2006 | Hauschild et al. | 430/30 |
| 2007/0019176 A1 * | 1/2007 | Akamatsu | 355/55 |
| 2008/0186466 A1 * | 8/2008 | Sirat et al. | 355/55 |

FOREIGN PATENT DOCUMENTS

| | | |
|---|---|---|
| JP | 2580668 | 11/1996 |
| JP | 2712330 | 10/1997 |
| JP | 2000-286189 | 10/2000 |
| JP | 2001-244168 | 9/2001 |
| JP | 2006-210895 | 8/2006 |

OTHER PUBLICATIONS

Ohtsuka et al. ("A novel multiple focus position control method by conjugate twin-shifter phase shift lithography," International Electron Devices Meeting, Technical Digest, 1991,pp. 59-62).*

Nomura ("Measurement of Wave-Front Aberrations in Lithography Lenses with an Overlay Inspection Tool," Optical Review, vol. 8, No. 4, 2001, pp. 227-234).*

* cited by examiner

*Primary Examiner* — Yubin Hung
(74) *Attorney, Agent, or Firm* — Finnegan, Henderson, Farabow, Garrett & Dunner, L.L.P.

(57) ABSTRACT

According to an aspect of the present invention, there is provided a method of monitoring a focus position on a surface of a wafer for an exposure apparatus which transfers by exposure a pattern formed on a mask onto the wafer, including tilting at least one of the mask and an exposure area on the wafer and performing exposure while the mask and the exposure area have a relative angle, to form two spurious resolution images of the pattern of the mask in the exposure area; measuring positions of the two spurious resolution images formed in the exposure area and detecting an optimal focus position of the exposure apparatus on the basis of a middle point between the measured positions of the two spurious resolution images.

20 Claims, 7 Drawing Sheets

FOCUS MONITORING METHOD

CROSS-REFERENCE TO RELATED APPLICATIONS

This application is based upon and claims the benefit of priority from prior Japanese Patent Application No. 2006-324468, filed Nov. 30, 2006, the entire contents of which are incorporated herein by reference.

BACKGROUND OF THE INVENTION

1. Field of the Invention

The present invention relates to a focus monitoring method in an exposure apparatus used for lithography of a semiconductor device and, more particularly, to a focus monitoring method of obtaining an optimal focus position of an EUV exposure apparatus using, e.g., soft X-rays.

2. Description of the Related Art

In recent years, importance is attached to the throughput in a lithography process for manufacturing, e.g., a semiconductor device or liquid crystal display device. From this viewpoint, there is often used an exposure apparatus of a sequential movement type such as a reduction projection exposure apparatus (so-called stepper) of a step & repeat scheme or a scanning exposure apparatus of a step & scan scheme as an improved version of the stepper. An exposure apparatus of this type mainly uses a so-called CD/focus method and SMP focus measurement method to measure an optimal focus position (best focus position) of an optical system (see, e.g., Japanese Patent Nos. 2580668 and 2712330).

The CD/focus method transfers a test pattern such as a line-and-space pattern to a plurality of positions on a test wafer in the optical axis direction of the projection optical system. A scanning electron microscope (SEM), for example, measures the line width of a resist image (transferred pattern image) obtained by developing the test wafer. The best focus position is then determined on the basis of the correlation between the measured line width and the wafer positions (to be also referred to as "focus positions" hereinafter as needed) in the optical axis direction of the projection optical system.

The SMP focus measurement method forms a resist image with a wedge-shaped mark at each of a plurality of focus positions. A change in the line width of the resist image between the focus positions is amplified and translated into a change in the dimension of the resist image in the longitudinal direction. The dimension of the resist image in the longitudinal direction is measured using a mark detection system such as an alignment system of the exposure apparatus. The best focus position is then detected (calculated) on the basis of the correlation between the focus position and the length of the resist image. On the basis of the thus obtained best focus position, astigmatism, curvature of field, and the like as the optical characteristics of the projection optical system are measured for various kinds of test patterns.

However, the CD/focus method requires strict focus adjustment of the SEM to measure the line width of, e.g., a resist image, resulting in too long a measurement time per point. Accordingly, it takes several hours to several tens of hours to perform measurement at a large number of points. Along with the micronization of a test pattern to measure the optical characteristics of the projection optical system, the number of evaluation points in the field of view of the projection optical system is expected to increase. Therefore, the conventional measurement method using an SEM inconveniently, considerably decreases the throughput until the measurement result is obtained.

It is becoming difficult for the conventional measurement method to meet growing demands for further reducing a measurement error and further increasing the reproducibility of the measurement result. To reduce the error, an approximation curve of the fourth or higher order is used to describe the correlation between the focus position and the line width. This requires calculating the line width at least at five focus positions for each evaluation point. To reduce the error, it is also necessary that the difference between the line width at the best focus position and that at a focus position (including both the positive and negative directions of the optical axis of the projection optical system) shifted from the best focus position should be 10% or more. However, it is becoming difficult to meet this condition.

The SMP focus measurement method normally performs measurement with monochromatic light, so interference may have a different influence on the resist image depending on its shape, leading to a measurement error (dimensional offset). To measure the length of a resist image with a wedge-shaped mark in image processing, it is necessary to capture detailed information ranging across the two ends of the resist image in the longitudinal direction, at which its pattern width is finest. However, the currently available image capturing devices (e.g., a CCD camera) have not obtained sufficient resolutions yet. It is also difficult to increase the number of evaluation points in the field of view of the projection optical system because the test pattern is large.

In this manner, the conventional EUV exposure apparatus using soft X-rays can hardly calculate an accurate optimal focus position of the optical system. Still worse, the measurement requires a relatively long time, resulting in decreases in exposure accuracy and throughput.

BRIEF SUMMARY OF THE INVENTION

According to an aspect of the present invention, there is provided a method of monitoring a focus position on a surface of a wafer for an exposure apparatus which transfers by exposure a pattern formed on a mask onto the wafer, comprising: tilting at least one of the mask and an exposure area on the wafer and performing exposure while the mask and the exposure area have a relative angle, to form two spurious resolution images of the pattern of the mask in the exposure area; measuring positions of the two spurious resolution images formed in the exposure area; and detecting an optimal focus position of the exposure apparatus on the basis of a middle point between the measured positions of the two spurious resolution images.

According to another aspect of the present invention, there is provided a method of monitoring a focus position on a surface of a wafer for an exposure apparatus which transfers by exposure a pattern formed on a mask onto the wafer, comprising: sequentially moving an exposure area on the wafer and performing exposure while changing a defocus amount for each exposure area, to form both two spurious resolution images of the pattern of the mask in the plurality of exposed exposure areas; measuring defocus positions where the two spurious resolution images are formed; and detecting an optimal focus position of the exposure apparatus on the basis of a middle point of the measured defocus positions where the two spurious resolution images are formed.

DETAILED DESCRIPTION OF THE INVENTION

Embodiments of the present invention will be described below with reference to the accompanying drawing.

Figure 1:
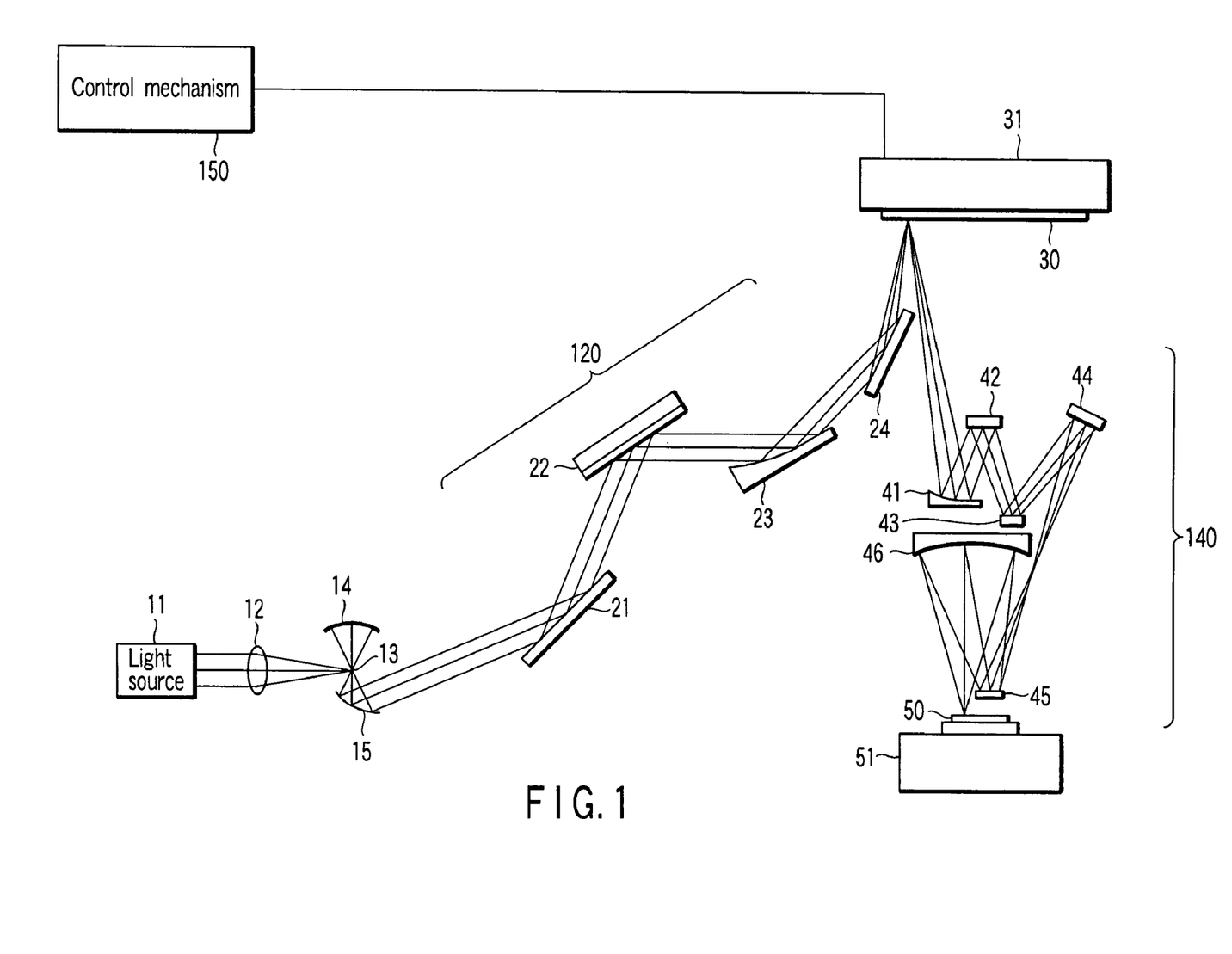
FIG. 1 is a view showing the schematic arrangement of a reduction projection exposure apparatus of a step & scan scheme used in the first embodiment.

FIG. 1 is a view showing the schematic arrangement of a reduction projection exposure apparatus of a step & scan scheme used in the first embodiment of the present invention.

As shown in FIG. 1, the exposure apparatus comprises a light source 11 which emits EUV light, an illumination optical system 120 which propagates the light emitted by the light source 11, and a mask stage 31 which holds a mask (reflecting reticle) 30 irradiated with the light propagated through the illumination optical system 120. The exposure apparatus further comprises a projection optical system 140 which propagates the light reflected by the mask 30, and a wafer stage 51 which holds a wafer 50 coated with a resist film to be exposed with the light propagated through the projection optical system 140.

The light source 11 emits a laser beam with a wavelength from the infrared range to the visible range. For example, the light source 11 emits a laser beam such as an yttrium aluminum garnet (YAG) laser beam or excimer laser beam by semiconductor laser excitation. A condenser lens 12 is juxtaposed to the light source 11. The condenser lens 12 converges the laser beam emitted by the light source 11 to a focal point 13. Xenon (Xe) gas is supplied to the focal point 13. The temperature of the Xe gas rises upon laser beam irradiation. The Xe gas is further excited to a plasma, and emits EUV light having a wavelength in the soft X-ray range from 12 nm to 14 nm in the process of transition to a low potential. The emitted EUV light is converged by an elliptical mirror 14 and reflected by a parabolic mirror 15.

The illumination optical system 120 which propagates the EUV light reflected by the parabolic mirror 15 comprises reflecting mirrors 21 and 22, condenser mirror 23, and optical path bending mirror 24. The EUV light is reflected by the reflecting mirrors 21 and 22 and further reflected and converged by the condenser mirror 23. The EUV light reflected and converged by the condenser mirror 23 is reflected by the optical path bending mirror 24, and reaches the mask 30 fixed on the mask stage 31 by an electrostatic attraction force.

The projection optical system 140 is arranged below the mask 30. The wafer stage 51 which holds the wafer 50 is arranged below the projection optical system 140. The projection optical system 140 comprises a condenser mirror 41, optical path bending mirrors 42 and 43, condenser mirror 44, optical path bending mirror 45, and condenser mirror 46. The EUV light reflected by the mask 30 is reflected and converged by the condenser mirror 41, and reflected by the optical path bending mirrors 42 and 43. The EUV light is further reflected and converged by the condenser mirror 44, and reflected by the optical path bending mirror 45. The EUV light reflected by the optical path bending mirror 45 is converged and reflected by the condenser mirror 46, and focused on the resist film applied on the surface of the wafer 50. The magnification of the projection optical system 140 is, e.g., ¼. Since air readily absorbs the EUV light, the illumination optical system 120, projection optical system 140, and the like are preferably kept under a vacuum environment. The mask stage 31 connects to a control mechanism 150.

In this arrangement, the illumination optical system 120 guides the EUV light onto the mask 30. The projection optical system 140 guides the reflected light onto the surface of the wafer 50. The projection optical system 140 reduces and transfers the pattern of the mask 30 onto the wafer 50. At this time, the mask stage 31 and wafer stage 51 are synchronously scanned in accordance with the reduction ratio of the projection optical system 140.

The exposure apparatus performs exposure by repeating a step & scan operation. Upon completing the exposure of the entire surface of the wafer 50, the processing of the next wafer starts. After all wafers have been exposed, the mask 30 is exchanged and a new mask 30 is exposed by repeating the same procedure again. To align the position of the wafer 50 in the Z direction (the optical axis direction of the projection optical system), a level detection sensor (Z sensor) measures the surface position of the wafer 50. The level of the wafer 50 is controlled in accordance with the resultant measurement information.

Figure 2:
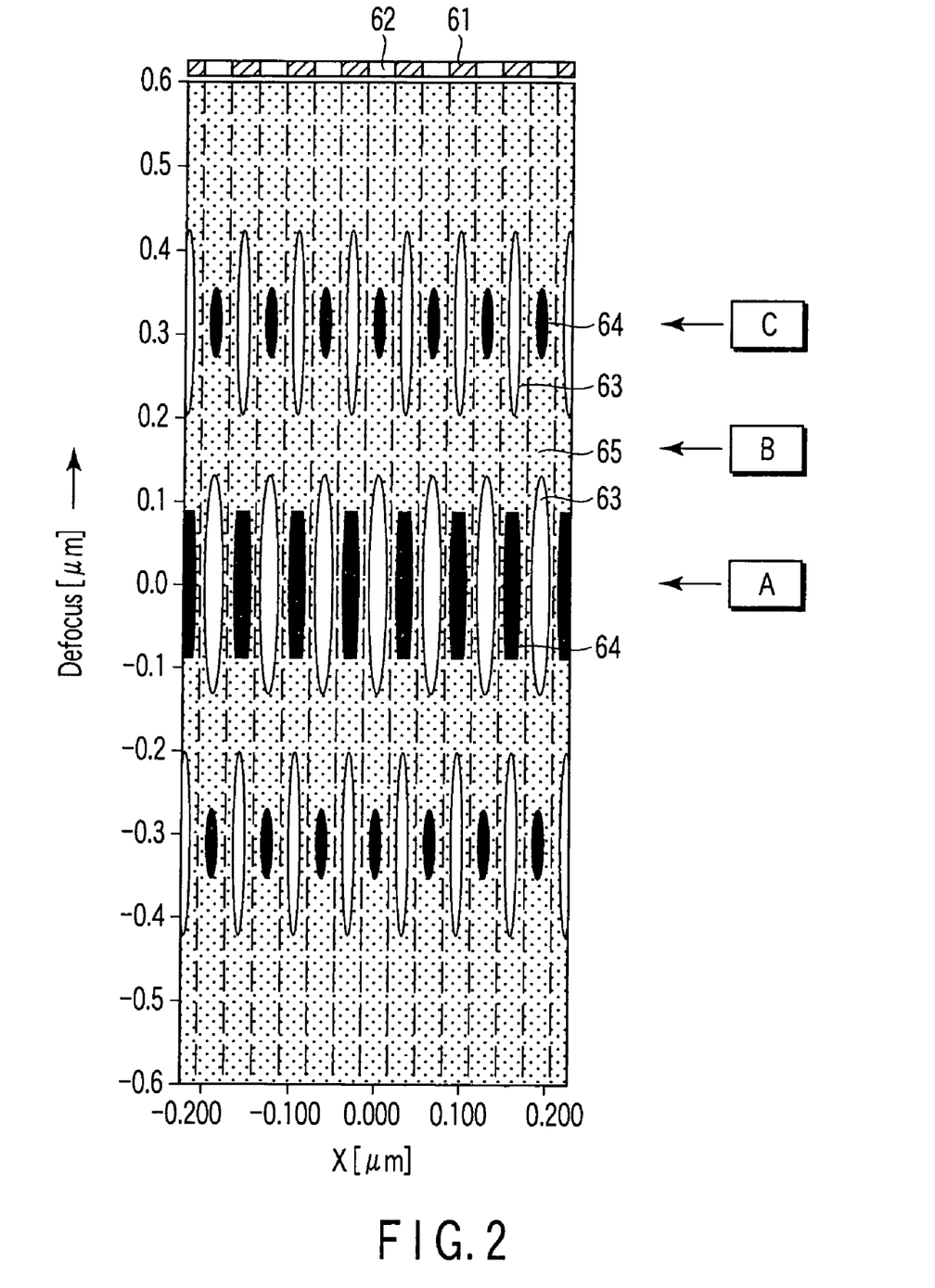
FIG. 2 is a diagram schematically showing the result obtained by simulating the contrast on a wafer.

Consider a case in which a mask pattern having uniform lines and spaces is transferred onto the wafer by exposure. FIG. 2 schematically shows the result obtained by simulating the contrast on the wafer. Referring to FIG. 2, reference number 61 indicates a line (light-shielding portion) on the mask; and 62, a space (light-transmitting portion) on the mask. FIG. 2 shows a state in which the image contrast of the pattern on the mask changes upon a change in focus position in the vertical direction of FIG. 2. The pattern is divided into bright regions 63, dark regions 64, and intermediate regions 65 on the basis of the contrast.

Figure 3:
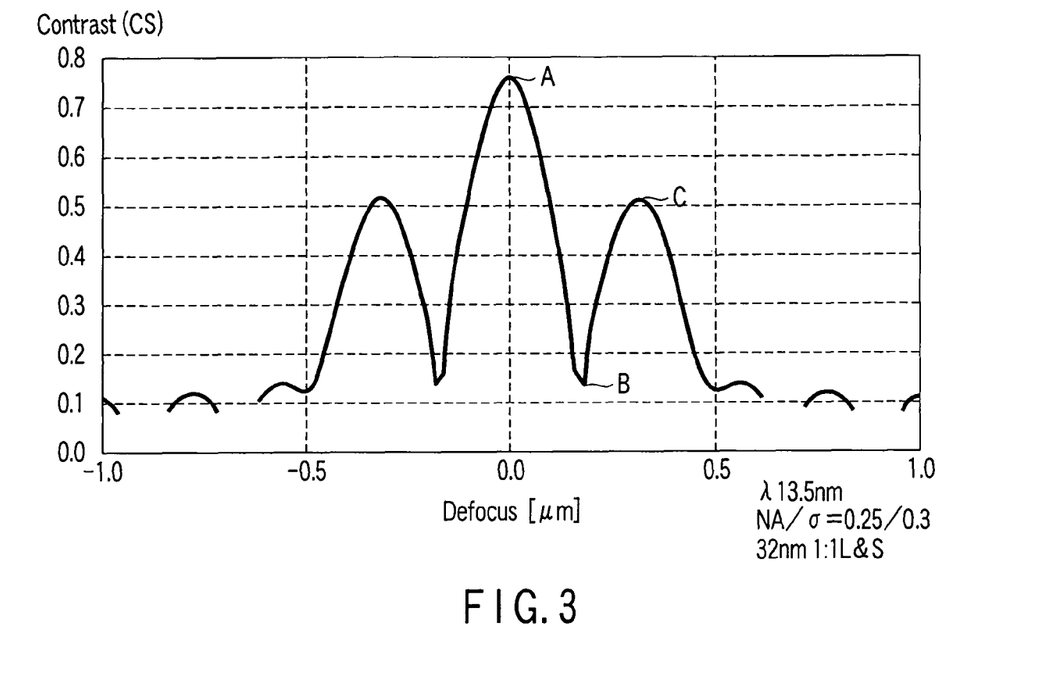
FIG. 3 is a graph showing the relationship between the defocus amount and the contrast.

The dimensions of the line and space on the wafer are 32 nm at 1:1. The NA of the projection optical system is 0.25. The coherence factor σ indicating the effective size of the illumination optical system is 0.3. The wavelength λ of exposure light is 13.5 nm. FIG. 3 is a graph showing the relationship between the defocus amount and the contrast.

The contrast takes a maximum value (A in FIG. 3) at the best focus position. Obviously, as defocusing progresses, the contrast lowers. When the defocusing continues, the contrast takes a local minimum value at a certain focus position (B in FIG. 3). At this position, the mask pattern does not resolve. When the defocusing further progresses, the contrast takes a peak value again at a certain position (C in FIG. 3). At this defocus position at which the contrast takes a peak value, an image (spurious resolution image) having a contrast inverted from that of the original mask image is formed on the wafer.

The image at the best focus position will be referred to as a true resolution image hereinafter in contrast to the spurious resolution image. When the defocusing further progresses, the contrast takes a local minimum value again at a certain position. These phenomena are observed irrespective of whether the defocus direction is positive or negative with respect to the best focus position.

Figure 4:
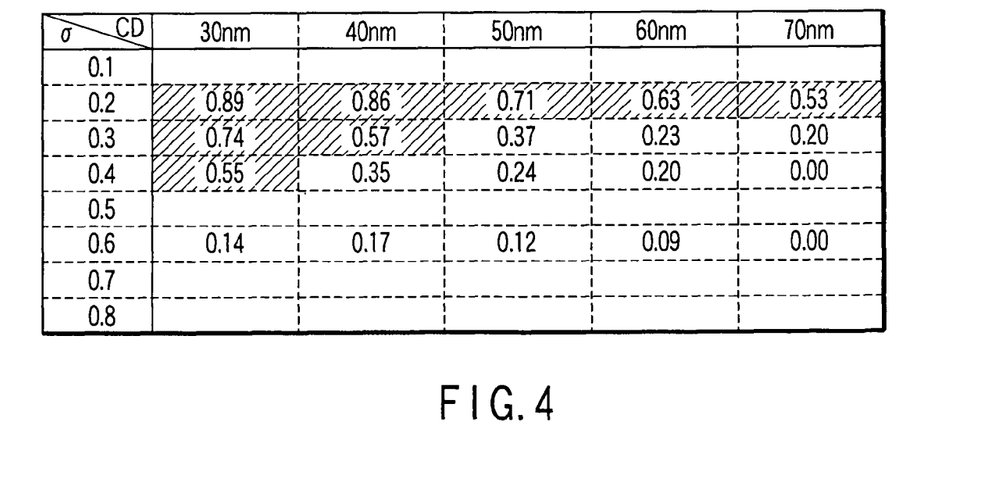
FIG. 4 is a table showing the result obtained by simulating a condition under which spurious resolution appears.
Figure 5:
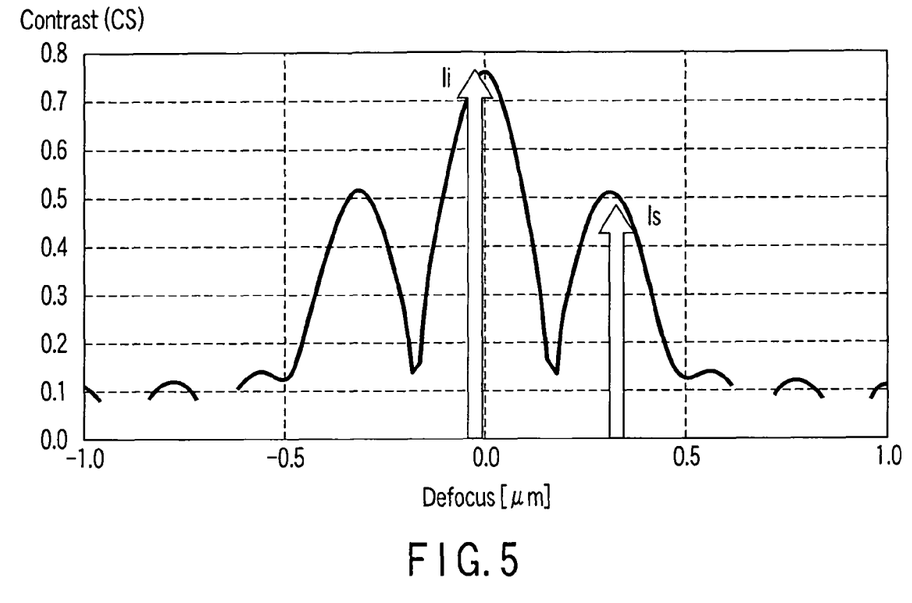
FIG. 5 is a graph showing the relationship between a level Ii of a true resolution image and a level Is of a spurious resolution image.

FIG. 4 shows the result obtained by simulating a condition under which the above-described spurious resolution appears. This simulation is performed to examine the dependency of the condition under which this spurious resolution appears on the illumination condition of the exposure apparatus. The contrast ratio between the true resolution image and the spurious resolution image is calculated assuming that the NA of the exposure apparatus is 0.25, and the coherence factor σ and pattern dimension at this time are used as parameters. That is, a ratio Ic between a level Ii of the true resolution image and a level Is of the spurious resolution image shown in FIG. 5 is calculated by:

$$Ic = Is/Ii$$

The larger the value Ic, the higher the contrast of the spurious resolution image.

As is apparent from FIG. 4, the smaller the dimension CD and coherence factor σ, the higher the ratio Ic. Assume that the desirable ratio Ic is 0.5 or more. If the dimension CD is 30 nm, the coherence factor σ is desirably 0.4 or less. If the dimension CD is 40 nm, the coherence factor σ is desirably 0.3 or less. If the dimension CD is 50 nm or more, the coherence factor σ is desirably 0.2 or less.

In view of this, an illumination condition under which spurious resolution is likely to occur is determined to be:

$$\sigma \leq a1/CD$$

where a1 is a constant (e.g., 14), CD is the dimension (nm) on the wafer, and a is the coherence factor.

Consider a case in which the wafer surface is actually exposed using the above-described phenomena. That is, consider a case in which true resolution images and spurious resolution images are formed during the same shot by the exposure apparatus.

Figure 6:
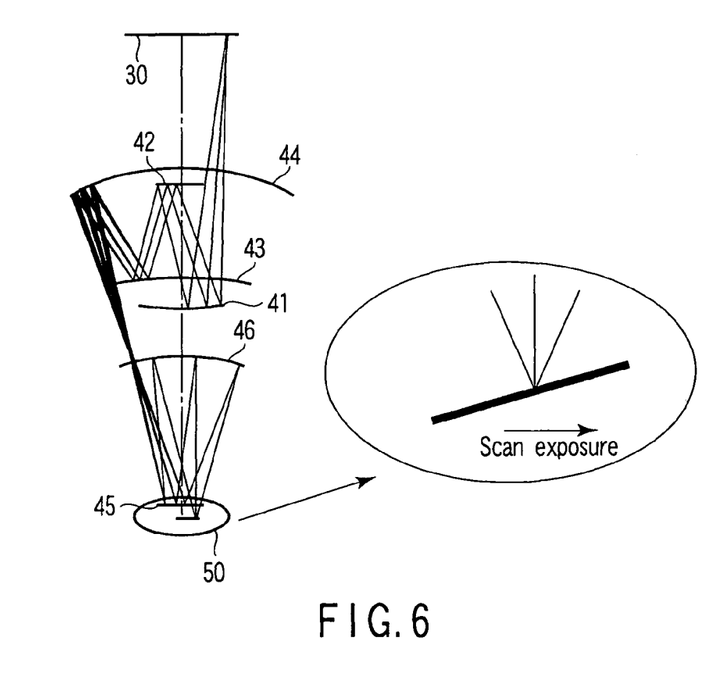
FIG. 6 is a view for explaining the main part of the first embodiment, which shows a state in which a shot area is exposed at a position shifted from the original imaging position upon adding a leveling offset.
Figure 7:
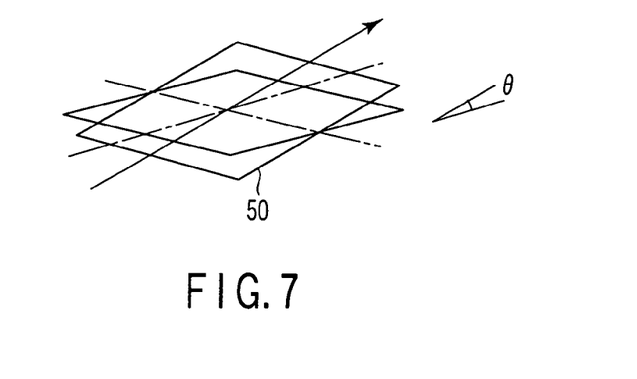
FIG. 7 is a view showing the relationship between an optimal focus position and the wafer position.

More specifically, as shown in FIG. 6, a shot area is exposed at a position shifted from the original imaging position upon adding a leveling offset. That is, as shown in FIG. 7, the wafer 50 is tilted from the original position at which it is parallel to the mask 30 in the scanning direction through θ.

When the exposure apparatus is of a scan scheme, it scans an exposure slit on the wafer by a desired shot size to form a desired mask pattern on the wafer. Exposure is performed upon adding a tilt (leveling offset) on a shot area by matching the best focus position with the vicinity of the center of the shot area. Then, the focus position is shifted from the best focus position in the negative side during the first half of a shot, while it is shifted from the best focus position in the positive side during the second half of the shot.

Figure 8:
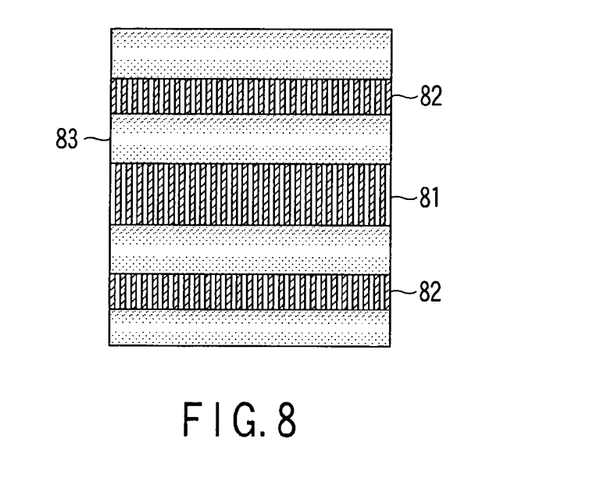
FIG. 8 is a view showing a state in which true resolution images, spurious resolution images, and regions that are somewhere between them and have zero contrast are formed in the same shot area.

The difference in level between the first and second halves of the shot changes depending on the leveling offset amount given to the shot. By adjusting the leveling offset amount to an appropriate one, true resolution images 81, spurious resolution images 82, and regions (unresolved images) 83 that are somewhere between them and have zero contrast are formed in the same shot area, as shown in FIG. 8.

Figure 9:
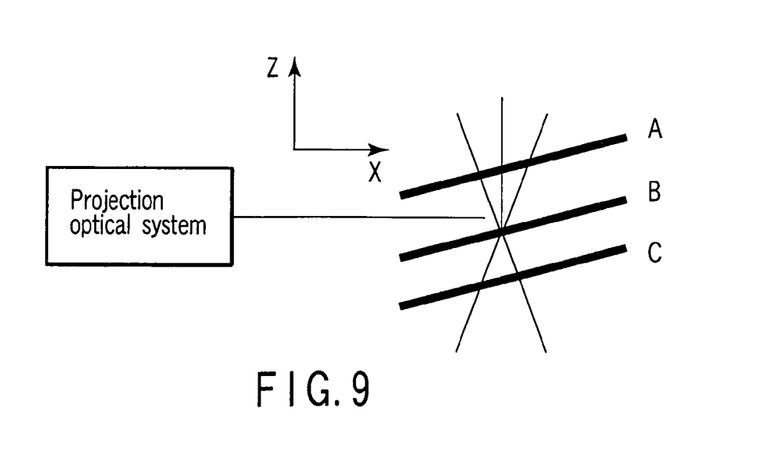
FIG. 9 is a view showing a state in which a pattern is transferred onto a wafer by exposure while changing the shot area in the focus direction at a constant leveling offset.

In this state, a pattern is transferred onto the wafer by exposure while changing the shot area in the focus direction at a constant leveling offset, as shown in FIG. 9. Referring to FIG. 9, reference symbol A indicates a case in which the best focus position lies farther than the wafer surface; B, a case in which the best focus position lies on the wafer surface; and C, a case in which the best focus position lies nearer than the wafer surface.

Figure 10A:
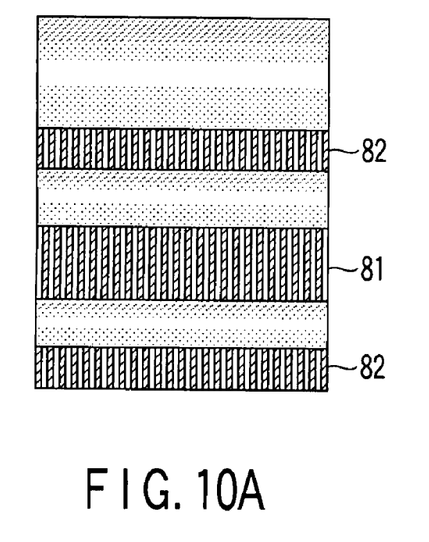
FIGS. 10A to 10C are views showing shot images formed on the wafer.
Figure 10B:
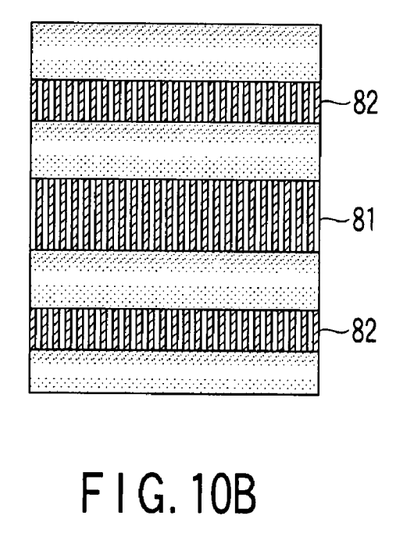
Figure 10C:
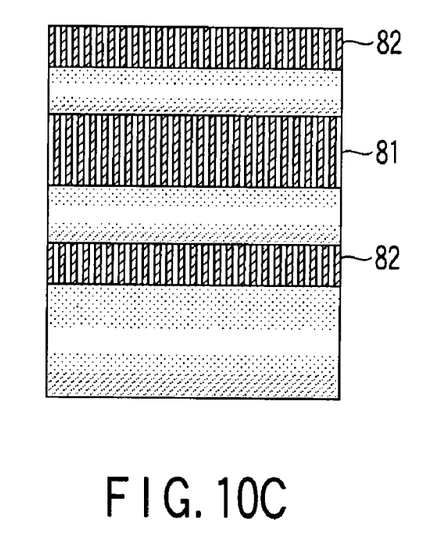

FIGS. 10A to 10C are views showing shot images formed on the wafer. FIGS. 10A to 10C correspond to A to C in FIG. 9, respectively. Spurious resolution images sandwich a true resolution image, and their positions move in the shot area.

The focus position in the shot area is adjusted such that the position of a true resolution image in the shot area matches the central portion of the shot area. Then, the shot area matches the best focus position upon removing the leveling offset from the shot area.

As described above, according to the first embodiment, both true resolution images and spurious resolution images of the mask pattern are formed in the same shot area upon adding the leveling offset. Therefore, the true resolution image is positioned at the middle point between the two spurious resolution images. As a result, the position of the true resolution image can be easily recognized as the middle point between the two spurious resolution images when compared with the case where the true resolution image is visually observed alone. This makes it possible to determine the best focus position of the projection optical system mainly by visual observation. That is, it is possible to easily determine an optimal focus condition of the exposure apparatus by visual observation or using a low-power microscope without using any special measurement device. It is therefore possible to improve the exposure accuracy and throughput.

Figure 11:
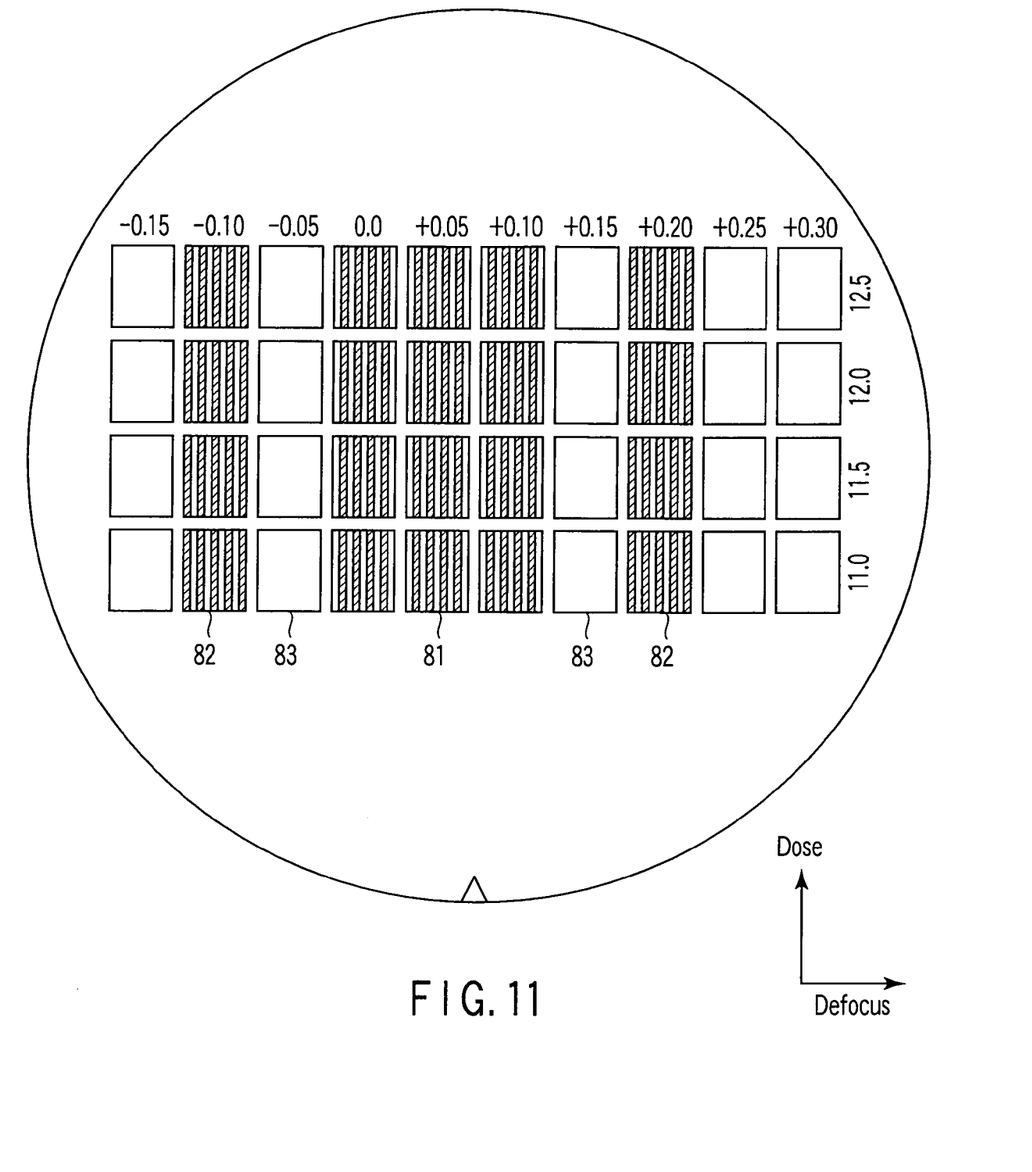
FIG. 11 is a view for explaining a focus monitoring method according to the second embodiment, which shows a pattern formed on a wafer by exposure while changing the focus position and exposure amount.

FIG. 11 is a view for explaining a focus monitoring method according to the second embodiment, which shows a pattern formed on a wafer by exposure while changing the focus position and exposure amount. In the second embodiment, the reduction projection exposure apparatus of a step & scan scheme used in the first embodiment is used. The basic operation of the exposure apparatus in the second embodiment is the same as that in the first embodiment. A mask pattern having uniform lines and spaces is transferred onto the wafer by exposure.

In the second embodiment, the exposure amount is changed while changing the position of the entire shot area on the wafer in the focus direction. FIG. 11 exemplifies a case in which exposure is performed while gradually changing the focus position and exposure amount in the horizontal direction and vertical direction, respectively. Numerical values shown in FIG. 11 each indicate the exposure amount or the setting value of the defocus amount on the apparatus. These values are not actually formed on the wafer, and are described in the drawing for the sake of convenience.

As described above, a true resolution image 81 of the pattern on the mask is formed at each best focus position of the apparatus. As the focus position changes, the contrast of formed images lowers. After the resolution becomes impossible, images 82 are formed again. In this case, a spurious resolution image pattern having a contrast inverted from that of the original mask pattern is formed.

More specifically, true resolution images 81 are formed at positions at which the defocus amounts are 0 to +0.10 μm. Spurious resolution images 82 are formed at positions at which the defocus amounts are −0.10 to +0.20 μm. Unresolved images 83 are formed at positions at which the defocus amounts are −0.15, −0.05, +0.15, +0.25, and +0.30 μm. Note that, in FIG. 11, borders between the true resolution images 81, the spurious resolution images 82, and the unresolved images 83 are definitely shown for the sake of convenience.

In this manner, similar phenomena are observed around the best focus position as a center in both the positive defocus direction and negative defocus direction. This makes it possible to determine the best focus position of the apparatus by visually observing this wafer. That is, since the contrast of the spurious resolution image becomes lower than that of the true resolution image, and the focus region in which the true resolution image can be obtained becomes small, an optimal focus can be detected more easily by recognizing the middle point between the two spurious resolution images as the center of the true resolution image than by visually observing the true resolution image alone.

In second embodiment, since positions at which the defocus amounts are +0.05 μm serve as the center of true resolution images in the focus direction, the best focus position of the apparatus can be determined to be +0.05 μm. Although the leveling offset is added in the first embodiment, it is unnecessary in the second embodiment. Hence, the second embodiment is applicable even when the shot size is not sufficiently large.

The present invention is not limited to the above-described embodiments. Although the wafer itself is tilted to have a tilted exposure area in the above-described embodiments, it need not always be tilted as long as the exposure area is tilted. Instead of tilting the exposure area on the wafer, the mask may be tilted. Both the mask and the exposure area on the wafer may be tilted.

The exposure apparatus used is not particularly limited to a reflection type EUV exposure apparatus using extreme ultraviolet light. For example, it is also possible to adopt a transmission type exposure apparatus and to change the wavelength of a light source used for exposure, as needed. Furthermore, the pattern used for focus monitoring is not particularly limited to a line-and-space pattern as long as it is monotone and uniform in one direction.

According to the above-described embodiments, it is possible to easily calculate an optimal focus position of an optical system in, e.g., an EUV exposure apparatus. This makes it possible to provide a focus monitoring method which can contribute to improving the exposure accuracy and throughput. That is, according to the above-described embodiments, it is possible to easily determine an optimal focus condition of the exposure apparatus by visual observation or using a low-power optical microscope without using any special measurement device. This makes it possible to contribute to improving the exposure accuracy and throughput.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of monitoring a focus position on a surface of a wafer for an exposure apparatus which transfers by exposure, through a projection optical system, a pattern formed on a mask onto the wafer, comprising:
   tilting, based on a measurement of a level detection sensor, an exposure area on the wafer and performing exposure while the mask and the exposure area have a relative angle, to form two spurious resolution images of the pattern of the mask in the exposure area;
   measuring, using a microscope, positions of the two spurious resolution images formed in the exposure area; and
   detecting an optimal focus position of the exposure apparatus on the basis of a middle point between the measured positions of the two spurious resolution images.

2. The method according to claim 1, wherein the pattern formed on the mask includes a monotone, uniform pattern.

3. The method according to claim 1, wherein the pattern formed on the mask is a pattern including a line-and-space pattern.

4. The method according to claim 1, wherein an optical system which illuminates the mask satisfies:

$$\sigma \leq a1/CD$$

where a1 is a constant, CD (nm) is a dimension, on the wafer, of the pattern formed on the wafer, and σ is a coherence factor.

5. The method according to claim 1, wherein the exposure apparatus includes a reduction projection exposure apparatus of a step and repeat scheme.

6. The method according to claim 1, wherein the exposure apparatus includes a reflection type exposure apparatus using extreme ultraviolet light.

7. The method according to claim 1, wherein the exposure apparatus includes a transmission type exposure apparatus.

8. The method according to claim 1, wherein the two spurious resolution images are formed by using a leveling offset.

9. A method of monitoring a focus position on a surface of a wafer for an exposure apparatus which transfers by exposure, through a projection optical system, a pattern formed on a mask onto the wafer, comprising:
   sequentially moving an exposure area on the wafer, as well as performing exposure using the projection optical system while changing a defocus amount for each exposure area, to form both two spurious resolution images of the pattern of the mask in the plurality of exposed exposure areas;
   measuring, using a microscope, defocus positions where the two spurious resolution images are formed; and
   detecting an optimal focus position of the exposure apparatus on the basis of a middle point of the measured defocus positions where the two spurious resolution images are formed.

10. The method according to claim 9, wherein the pattern formed on the mask is a pattern including a line-and-space pattern.

11. The method according to claim 9, wherein an optical system which illuminates the mask satisfies:

$$\sigma \leq a1/CD$$

where a1 is a constant, CD (nm) is a dimension, on the wafer, of the pattern formed on the wafer, and σ is a coherence factor.

12. The method according to claim 9, wherein the exposure apparatus includes a reduction projection exposure apparatus of a step and repeat scheme.

13. The method according to claim 9, wherein the exposure apparatus includes a reflection type exposure apparatus using extreme ultraviolet light.

14. The method according to claim 9, wherein the exposure apparatus includes a transmission type exposure apparatus.

15. A method of monitoring a focus position on a surface of a wafer for an exposure apparatus that has a mask stage capable of tilting by a control mechanism and transfers by exposure a pattern formed on a mask onto the wafer, the mask being fixed on the mask stage, comprising:
   tilting the mask by the control mechanism and performing exposure while the mask and the exposure area have a relative angle, to form two spurious resolution images of the pattern of the mask in the exposure area;

measuring, using a microscope, positions of the two spurious resolution images formed in the exposure area; and detecting an optimal focus position of the exposure apparatus on the basis of a middle point between the measured positions of the two spurious resolution images.

16. The method according to claim 15, wherein the pattern formed on the mask includes a monotone, uniform pattern.

17. The method according to claim 15, wherein the pattern formed on the mask is a pattern including a line-and-space pattern.

18. The method according to claim 15, wherein an optical system which illuminates the mask satisfies:

$$\sigma \leq a1/CD$$

where a1 is a constant, CD (nm) is a dimension, on the wafer, of the pattern formed on the wafer, and $\sigma$ is a coherence factor.

19. The method according to claim 15, wherein the exposure apparatus includes a reduction projection exposure apparatus of a step and repeat scheme.

20. The method according to claim 15, wherein the exposure apparatus includes a reflection type exposure apparatus using extreme ultraviolet light or a transmission type exposure apparatus.

* * * * *